(12) United States Patent
Kojima et al.

(10) Patent No.: US 11,469,339 B2
(45) Date of Patent: Oct. 11, 2022

(54) SOLAR CELL MODULE

(71) Applicant: KANEKA CORPORATION, Osaka (JP)

(72) Inventors: Kohei Kojima, Settsu (JP); Toru Terashita, Settsu (JP); Gensuke Koizumi, Settsu (JP); Junichi Nakamura, Settsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/785,444

(22) Filed: Feb. 7, 2020

(65) Prior Publication Data

US 2020/0176621 A1 Jun. 4, 2020

Related U.S. Application Data

(63) Continuation of application No. PCT/JP2018/020054, filed on May 24, 2018.

(30) Foreign Application Priority Data

Aug. 10, 2017 (JP) .............................. JP2017-155597

(51) Int. Cl.
*H01L 31/049* (2014.01)
*G01J 3/46* (2006.01)
(Continued)

(52) U.S. Cl.
CPC ............ *H01L 31/049* (2014.12); *G01J 3/462* (2013.01); *G01J 3/50* (2013.01); *H01L 31/055* (2013.01);
(Continued)

(58) Field of Classification Search
CPC .... H01L 31/048; H01L 31/0481; H01L 31/05
(Continued)

(56) References Cited

U.S. PATENT DOCUMENTS

| 6,294,722 B1 | 9/2001 | Kondo et al. |
| 2010/0231386 A1* | 9/2010 | Barnes ................... H01L 31/04 340/541 |

(Continued)

FOREIGN PATENT DOCUMENTS

| JP | 2000-252505 A | 9/2000 |
| JP | 2005-079170 A | 3/2005 |

(Continued)

OTHER PUBLICATIONS

International Search Report issued in PCT/JP2018/020054; dated Aug. 21, 2018.

(Continued)

*Primary Examiner* — Angelo Trivisonno
(74) *Attorney, Agent, or Firm* — Studebaker & Brackett PC (57) ABSTRACT

A solar cell module, which is easily coordinated with the color of an exterior member at the installation position, comprises a solar cell; a light receiving side sealing material and a light receiving side protection member laminated and disposed in this order on a light receiving side with reference to the solar cell; and a back-side sealing material and a back-side protection member laminated and arranged in this order on a back side on the opposite side from the light receiving side. A value computed from a measured value of the color of reflected light combining positive reflected light and diffused reflected light which are based on light that has become incident on an object to be measured, and a measured value of the color only of the diffused reflected light based on the light that has become incident on the object to be measured, satisfies a specific condition.

17 Claims, 2 Drawing Sheets

(51) Int. Cl.
*G01J 3/50* (2006.01)
*H01L 31/05* (2014.01)
*H01L 31/055* (2014.01)
*H01L 31/068* (2012.01)

(52) U.S. Cl.
CPC ...... *H01L 31/0508* (2013.01); *H01L 31/0682* (2013.01)

(58) Field of Classification Search
USPC .......................................................... 136/256
See application file for complete search history.

(56) References Cited

U.S. PATENT DOCUMENTS

| | | |
|---|---|---|
| 2012/0247541 A1 | 10/2012 | Wootton |
| 2012/0298194 A1 | 11/2012 | Hergert et al. |
| 2016/0359064 A1* | 12/2016 | Ishiguro .............. H01L 31/0547 |
| 2017/0069767 A1 | 3/2017 | Kim et al. |
| 2017/0104448 A1* | 4/2017 | Long ........................ H02S 50/15 |
| 2018/0342640 A1* | 11/2018 | Kang ................ B32B 17/10018 |

FOREIGN PATENT DOCUMENTS

| | | |
|---|---|---|
| JP | 2010-243353 A | 10/2010 |
| JP | 2012-216689 A | 11/2012 |
| JP | 2014-139992 A | 7/2014 |
| JP | 2015-220894 A | 12/2015 |
| JP | 2016-000949 A | 1/2016 |
| JP | 2016-186156 A | 10/2016 |
| JP | 2017-050541 A | 3/2017 |
| WO | 2012/129706 A1 | 10/2012 |

OTHER PUBLICATIONS

Ishikawa et al., "PV Modules, Using Color Solar Cells, Designed for Building", World Conference on Photovoltaic Energy. Waikoloa, Dec. 5-9, 1994; [World Conference on Photovoltaic Energy], New York, IEEE, US, vol. Conf. 1, Dec. 5, 1994, pp. 977-980, XP000681362.
The extended European search report issued by the European Patent Office dated Apr. 29, 2020, which corresponds to European Patent Application No. 18843957.4-1230 and is related to U.S. Appl. No. 16/785,444.

\* cited by examiner

SOLAR CELL MODULE

CROSS-REFERENCE TO RELATED APPLICATIONS

This application claims benefit of priority to International Patent Application No. PCT/JP2018/020054, filed May 24, 2018, and to Japanese Patent Application No. 2017-155597, filed Aug. 10, 2017, the entire contents of each are incorporated herein by reference.

BACKGROUND

Technical Field

The present disclosure relates to a solar cell module.

Background Art

With today's increasing environmental awareness, efforts toward ZEH (net zero energy house) and ZEB (net zero energy building) have become active. For ZEH, ZEB, a building itself has to produce necessary power and solar cell modules are being studied as power generation means.

Solar cell modules are installed on a building. Since necessary power cannot be provided if the solar cell modules are installed only on the roof of the building, it is considered to install solar cell modules in a place other than the roof and such a technological development is being advanced. Examples of such a technological development may include a solar cell-integrated wall material as disclosed in Japanese Unexamined Patent Application, Publication No. 2016-186156 and a mount for installing solar cell modules on a wall surface as disclosed in Japanese Unexamined Patent Application, Publication No. 2016-000949.

SUMMARY

However, in the case of installing solar cell modules on a wall surface of a building, the solar cell modules directly enter the field of vision of a pedestrian or the like present outdoors and light pollution by reflected light from the solar cell modules has to be considered. Further, the solar cell modules are poor in appearance variation and do not fit into the appearance of the wall surface (e.g. color of the wall surface) and could also cause a reduction in the designability of the building in the case of being installed on the wall surface.

Accordingly, the present disclosure provides a solar cell module which is easily harmonized with the color of an exterior member (wall surface, building material, building or the like) serving as a location where the solar cell module is installed and develops the same type of color as a whole.

A solar cell module of the present disclosure includes a solar cell, a light receiving side sealing material and a light receiving side protection member which are laminated and arranged in this order on a light receiving side with reference to the solar cell, and a back-side sealing material and a back-side protection member which are laminated and arranged in this order on a back side opposite to the light receiving side with reference to the solar cell.

In this solar cell module, a value calculated from a measurement value Px(L*[Px], a*[Px], b*[Px]) of the color of reflected light combining specularly reflected light and diffused reflected light based on light incident on an object to be measured and a measurement value Qx(L*[Qx], a*[Qx], b*[Qx]) of the color only of the diffused reflected light based on the light incident on the object to be measured (CIE1976L*a*b* color system is used for L*, a*, b* and an identification code g, m, s, c, k, t is inserted into x) is as follows.

(1) A chroma C[Pg] based on a measurement value Pg(L*[Pg], a*[Pg], b*[Pg]) and a chroma C*[Qg] based on a measurement value Qg(L*[Qg], a*[Qg], b*[Qg]) for the light receiving side protection member itself satisfy the following condition.

$C^*[Pg] \leq 5$, and $C^*[Qg] \leq 5$ where $C^*[Pg]=(a^*[Pg]^2+b^*[Pg]^2)^{1/2}$, and $C^*[Qg]=(a^*[Qg]^2+b^*[Qg]^2)^{1/2}$.

(2) A difference $\Delta T[m]$ between a chroma C*[Pm] based on a measurement value Pm(L*[Pm], a*[Pm], b*[Pm]) and a chroma C*[Qm] based on a measurement value Qm(L*[Qm], a*[Qm], b*[Qm]) by light incident from the light receiving side protection member on a part, in which the light receiving side protection member, the light receiving side sealing material, the back-side sealing material and the back-side protection member are laminated in this order from the light receiving side toward the back side satisfies the following condition.

$\Delta T[m] \geq 6$ where $\Delta T[m]=C^*[Qm]-C^*[Pm]=(a^*[Qm]^2+b^*[Qm]^2)^{1/2}-(a^*[Pm]^2+b^*[Pm]^2)^{1/2}$.

(3) A chromaticity difference $\Delta E[m-s]$ calculated from the measurement value Qm(L*[Qm], a*[Qm], b*[Qm]) in (2) and a measurement value Qs(L*[Qs], a*[Qs], b*[Qs]) by light incident from the light receiving side protection member on a part, in which the light receiving side protection member, the light receiving side sealing material and the solar cell are laminated in this order from the light receiving side toward the back side satisfies the following condition.

$\Delta E[m-s] \leq 30$ where $\Delta E[m-s]=\{(L^*[Qm]-L^*[Qs])^2+(a^*[Qm]-a^*[Qs])^2+(b^*[Qm]-b^*[Qs])^2\}^{1/2}$.

Another solar cell module of the present disclosure includes a solar cell, a light receiving side sealing material and a light receiving side protection member which are laminated and arranged in this order on a light receiving side with reference to the solar cell, and a back-side sealing material and a back-side protection member which are laminated and arranged in this order on a back side opposite to the light receiving side with reference to the solar cell.

In this solar cell module, a value calculated from a measurement value D50Px(L*[50Px], a*[50Px], b*[50Px]) of the color of reflected light combining specularly reflected light and diffused reflected light and a measurement value D50Qx(L*[50Qx], a*[50Qx], b*[50Qx]) of the color only of the diffused reflected light based on D50 light incident on an object to be measured, and a measurement value D65Px(L*[65Px], a*[65Px], b*[65Px]) of the color of reflected light combining specularly reflected light and diffused reflected light and a measurement value D65Qx(L*[65Qx], $a^*[65Qx]$, $b^*[65Qx]$) of the color only of the diffused reflected light based on D65 light incident on the object to be measured (CIE1976L*a*b* color system is used for $L^*$, $a^*$, $b^*$ and an identification code g, m, s is inserted into x) is as follows.

(1') A chroma $C^*[50Pg]$ based on the measurement value $D50Pg(L^*[50Pg], a^*[50Pg], b^*[50Pg])$, a chroma $C^*[50Qg]$ based on the measurement value $D50Qg(L^*[50Qg], a^*[50Qg], b^*[50Qg])$, a chroma $C^*[65Pg]$ based on the measurement value $D65Pg(L^*[65Pg], a^*[65Pg], b^*[65Pg])$ and a chroma $C^*[65Qg]$ based on the measurement value $D65Qg(L^*[65Qg], a^*[65Qg], b^*[65Qg])$ for the light receiving side protection member itself satisfy the following condition.

$C^*[50Pg] \leq 5$, $C^*[50Qg] \leq 5$, $C^*[65Pg] \leq 5$, and $C^*[65Qg] \leq 5$ where $C^*[50Pg] = (a^*[50Pg]^2 + b^*[50Pg]^2)^{1/2}$, $C^*[50Qg] = (a^*[50Qg]^2 + b^*[50Qg]^2)^{1/2}$, $C^*[65Pg] = (a^*[65Pg]^2 + b^*[65Pg]^2)^{1/2}$, and $C^*[65Qg] = (a^*[65Qg]^2 + b^*[65Qg]^2)^{1/2}$.

(3') A chromaticity difference $\Delta E[50Qm-50Qs]$ and a chromaticity difference $\Delta E[65Qm-65Qs]$ calculated from a measurement value $D50Qm(L^*[50Qm], a^*[50Qm], b^*[50Qm])$ and a measurement value $D65Qm(L^*[65Qm], a^*[65Qm], b^*[65Qm])$ by light incident from the light receiving side protection member on a part, in which the light receiving side protection member, the light receiving side sealing material, the back-side sealing material and the back-side protection member are laminated in this order from the light receiving side toward the back side and a measurement value $D50Qs(L^*[50Qs], a^*[50Qs], b^*[50Qs])$ and a measurement value $D65Qs(L^*[65Qs], a^*[65Qs], b^*[65Qs])$ by light incident from the light receiving side protection member on a part, in which the light receiving side protection member, the light receiving side sealing material and the solar cell are laminated in this order from the light receiving side toward the back side satisfy the following condition.

$\Delta E[50Qm-50Qs] \leq 30$, and $\Delta E[65Qm-65Qs] \leq 30$ where $\Delta E[50Qm-50Qs] = \{(L^*[50Qm]-L^*[50Qs])^2 + (a^*[50Qm]-a^*[50Qs])^2 + (b^*[50Qm]-b^*[50Qs])^2\}^{1/2}$, and $\Delta E[65Qm-65Qs] = \{(L^*[65Qm]-L^*[65Qs])^2 + (a^*[65Qm]-a^*[65Qs])^2 + (b^*[65Qm]-b^*[65Qs])^2\}^{1/2}$.

(6) A value $\Delta U[Qs]$ calculated from the measurement value $D50Qs(L^*[50Qs], a^*[50Qs], b^*[50Qs])$ and the measurement value $D65Qs(L^*[65Qs], a^*[65Qs], b^*[65Qs])$ satisfies the following condition.

$\Delta U[Qs] \geq 1$ where $\Delta U[Qs] = \{(L^*[50Qs]-L^*[65Qs])^2 + (a^*[50Qs]-a^*[65Qs])^2 + (b^*[50Qs]-b^*[65Qs])^2\}^{1/2}$.

According to the present disclosure, the solar cell module develops the same type of color as a whole and is easily harmonized with the color of an exterior member, which is an installation location of the solar cell module. As a result, the designability of the exterior member is enhanced.

DETAILED DESCRIPTION

One embodiment of the present disclosure is described below, but the present disclosure is not limited thereto. For the sake of convenience, hatching, member reference numbers, etc. may be omitted. However, in such cases, other drawings shall be referred to. Dimensions of various members in the drawings are adjusted for the sake of visibility.

<<Solar Cell Module>>

FIGS. 1 to 8 are schematic cross-sectional views and plan views showing a solar cell module 19 including at least a solar cell 11, a sealing material 12 (light receiving side sealing material 12U, back-side sealing material 12B), a light receiving side protection member 13 and a back-side protection member 14.

Figure 1:
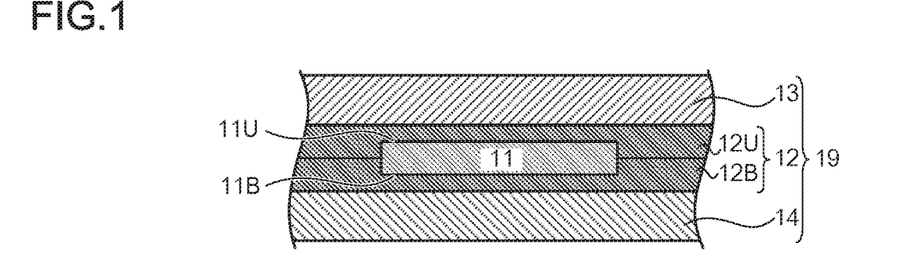
FIG. 1 is a cross-sectional view of a solar cell module.
Figure 2:
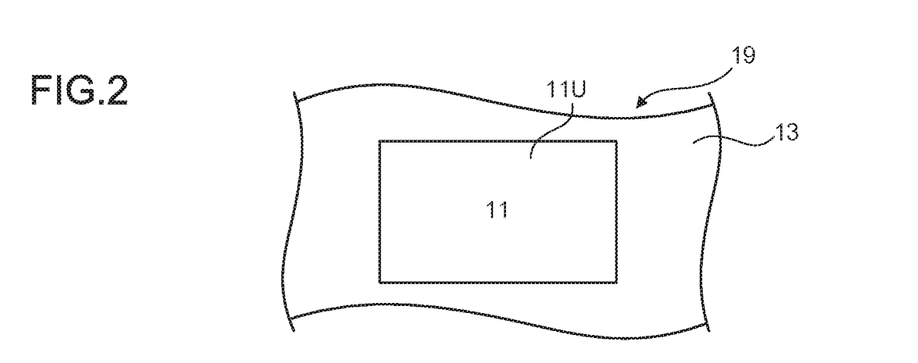
FIG. 2 is a plan view of the solar cell module of FIG. 1.
Figure 7:
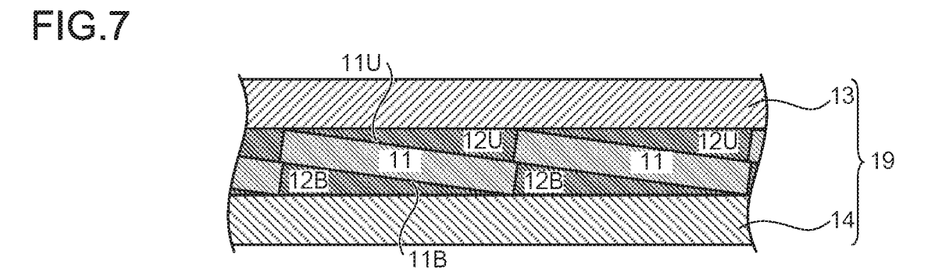
FIG. 7 is a cross-sectional view of a solar cell module mounted with solar cells connected in a shingling manner.
Figure 8:
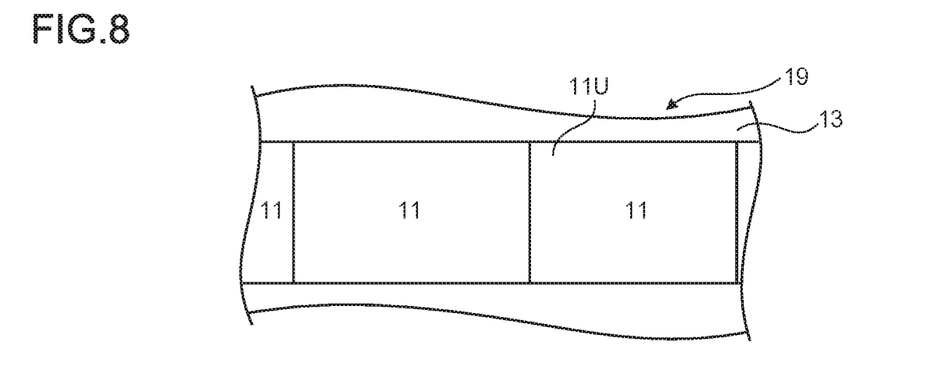
FIG. 8 is a plan view of the solar cell module of FIG. 7.

FIGS. 1 and 2 show the solar cell module 19 including one solar cell 11. FIGS. 3 and 4 and FIGS. 5 and 6 show solar cell modules 19 in which a plurality of solar cells 11 are electrically connected by wiring members 15 for connection. FIGS. 7 and 8 show a solar cell module 19 in which a plurality of solar cells 11 are electrically connected to each other without using any wiring member for connection. An aggregate of the electrically connected solar cells 11 as shown in FIGS. 3 to 8 may also be referred to as a solar cell string.

<Solar Cell>

The solar cell 11 includes a front surface 11U and a back surface 11B as major surfaces. In this specification, the side of the front surface 11U is referred to as a front side, and the side of the back surface 11B opposite to the front side is referred to as a back side. For the sake of convenience, the front side will be described as a side (light receiving side/visual confirmation side) which is caused to more actively receive light than the back side, and the back side that is not caused to actively receive light will be described as a non-light receiving side (non-visual confirmation side).

Accordingly, as shown in FIGS. 1, 3, 5 and 7, the solar cell module 19 includes the solar cell 11, the light receiving side sealing material 12U and the light receiving side protection member 13 that are laminated and arranged in this order on a light receiving side with reference to the solar cell 11, and the back-side sealing material 12B and the back-side protection member 14 that are laminated and arranged in this order on a back side opposite to the light receiving side.

The type of the solar cell 11 is not particularly limited. An example of the solar cell 11 may include a single-crystal silicon solar cell, a multi-crystal silicon solar cell, a thin-film silicon solar cell, a hetero-junction silicon solar cell, a compound solar cell or an organic thin-film solar cell.

A method for manufacturing the solar cell 11 is also not particularly limited. An example of the manufacturing method may include a method for manufacturing the solar cell 11 by providing a first conductivity type area (e.g. p-type area) and a second conductivity type area (e.g. n-type area) on a semiconductor substrate by known lamination means and providing a first electrode on the first conductivity type area and a second electrode on the second conductivity type area (for the sake of convenience, the above conductivity type areas and electrodes are not shown).

The type of an electrode structure in the solar cell 11 is also not particularly limited. For example, the solar cell 11 may be a backside electrode type solar cell 11 having an electrode only on the back surface 11B (see FIGS. 3 and 4) or may be a double-sided electrode type solar cell 11 having electrodes on the front surface (light receiving surface) 11U and the back surface 11B thereof (see FIGS. 5 and 6).

The backside electrode solar cell 11 has no electrode on the light receiving surface 11U. Thus, the solar cell module 19 with a plurality of backside electrode solar cells 11 having the light receiving surfaces 11U of the same color is visually confirmed to have the same type of color as a whole and has a high designability.

On the other hand, if the electrodes are processed to have the same type of color as the light receiving surface 11U (e.g. blackening process) in the double-sided electrode type solar cell 11, the electrode on the light receiving surface 11U becomes inconspicuous. Thus, the solar cell module 19 with a plurality of such double-sided electrode type solar cells 11 is also visually confirmed to have the same type of color as a whole and has a high designability.

In the solar cell module 19 in which the plurality of solar cells 11 are electrically connected to each other by a connection method called shingling (see FIGS. 7 and 8), a part of the major surface on the light receiving side of one solar cell 11 (end surface, which is a part of a peripheral edge of the light receiving surface 11U) and a part of the major surface on the back side of the other solar cell 11 (end surface, which is a part of a peripheral edge of the back surface 11B) overlap between adjacent ones of the solar cells 11.

In such a solar cell module 19, even if the light receiving surface 11U of one solar cell 11 of the adjacent solar cells 11 has a wiring member such as a so-called busbar electrode, the wiring member is covered by the back surface 11B of the other solar cell 11. Thus, this solar cell module 19 is provided with a plurality of solar cells 11 whose light receiving surfaces 11U have the same color, is visually confirmed to have the same type of color as a whole and has a high designability.

An anti-reflective layer or optical adjustment layer may be laminated on the light receiving side of the solar cell 11 as described above. If a thickness or a material of such an anti-reflective layer or optical adjustment layer is appropriately designed, light reflected by the front surface 11U of the solar cell 11 is properly controlled. Thus, the anti-reflective layer or optical adjustment layer is suitable for the adjustment of the color of the solar cell module 19.

<Sealing Material>

The sealing material 12 is for sealing and protecting the solar cell 11 and interposed between the light receiving surface 11U of the solar cell 11 and the light receiving side protection member 13 and between the back surface 11B of the solar cell 11 and the back-side protection member 14. In the following description, the sealing material 12 for covering the light receiving surface 11U of the solar cell 11 may be referred to as the light receiving side sealing material 12U and the sealing material 12 for covering the back surface 11B of the solar cell 11 may be referred to as the back-side sealing material 12B.

The shapes of the light receiving side sealing material 12U and the back-side sealing material 12B are not particularly limited, and may have, for example, sheet-like shapes. This is because the both major surfaces 11U, 11B of the planar solar cell 11 are easily covered if the sheet-like shapes are adopted.

The material of the sealing material 12 is not particularly limited, but is preferably resistant to ultraviolet rays while having a property of transmitting light (translucency). The material of the sealing material 12 is also preferably adhesive to bond the solar cell 11, the light receiving side protection member 13 and the back-side protection member 14.

Translucent resin such as ethylene/vinyl acetate copolymer (EVA), ethylene/α-olefin copolymer, ethylene/vinyl acetate/triallylisocyanurate (EVAT), polyvinyl butyrate (PVB), acrylic resin, urethane resin or silicone resin can be given as an example of such a material. The material of the light receiving side sealing material 12U and that of the back-side sealing material 12B may be the same or may be different. Such a material may also contain an additive such as an organic peroxide, a silane coupling agent, an ultraviolet absorber, a cross-linking aid, a heat-resistant stabilizer or a light-resistant stabilizer.

The light receiving side sealing material 12U preferably contains a wavelength converting additive for converting ultraviolet rays and emitting visible light. If such a wavelength converting additive is contained, ultraviolet rays not contributing to the power generation of the solar cell 11 are converted into visible light contributing to power generation. Thus, the power generation amount of the solar cell 11 and, consequently, of the solar cell module 19 increases.

The wavelength converting additive converts received ultraviolet rays into visible light and emits the visible light rather than absorbing the visible light and reflecting the remaining light, for example, like a dye or pigment. Thus, the color of the solar cell module 19 is more vividly visually confirmed, for example, as compared to a solar cell module colored by a dye or the like contained in a light receiving side sealing material. Due to light emission, color matching of various members included in the solar cell module 19 is easily adjusted (adjustment of making the solar cell module 19 have the same type of color as a whole).

The material of the wavelength converting additive is not particularly limited, but a metal complex including a rare earth element having fluorescence of visible light, an organic pigment, an inorganic phosphor or the like can be given as an example. Such a wavelength converting additive is dispersed in resin serving as the material of the sealing material 12 and the resin is molded into a sheet or the like, whereby the sealing material 12 dispersed with the wavelength converting additive is obtained.

<Light Receiving Side Protection Member>

The light receiving side protection member 13 protects the solar cell 11 by covering the light receiving surface 11U of the solar cell 11 via the light receiving side sealing material 12U. The shape of the light receiving side protection member 13 is not particularly limited, but is preferably plate-like or sheet-like in terms of indirectly covering the planar light receiving surface 11U.

The material of the light receiving side protection member 13 is not particularly limited, but is preferably a material resistant to ultraviolet rays while being translucent, similarly to the sealing material 12. An example of the material may include glass or transparent resin such as acrylic resin or polycarbonate resin. The surface of the light receiving side protection member 13 may be processed to be uneven or may be coated with an anti-reflective coating layer. This is because the light receiving side protection member 13 can guide more light to the solar cell 11 by making receiving light less likely to be reflected if the surface is processed as just described.

<Back-Side Protection Member>

The back-side protection member 14 protects the solar cell 11 by covering the back surface 11B of the solar cell 11 via the back-side sealing material 12B. The shape of the back-side protection member 14 is not particularly limited, but is preferably plate-like or sheet-like in terms of indirectly covering the planar back surface 11B, similarly to the light receiving side protection member 13.

The material of the back-side protection member 14 is not particularly limited, but is preferably a material which prevents the intrusion of water or the like (high water imperviousness). An example of the material may include a laminate of a resin film made of polyethylene terephthalate (PET), polyethylene (PE), olefin-based resin, fluorine-containing resin or silicone-containing resin and a metal foil such as an aluminum foil.

<Other Members>

The solar cell module 19 including the plurality of solar cells 11 as shown in FIGS. 3 to 6 includes, for example, the wiring members 15 for connection (hereinafter, also referred to as connection wirings 15). The connection wirings 15 are used, for example, for the connection of the electrodes of the adjacent solar cells 11, the connection of solar cell strings or the connection of an extraction wiring from the solar cell string to an external device.

Figure 3:
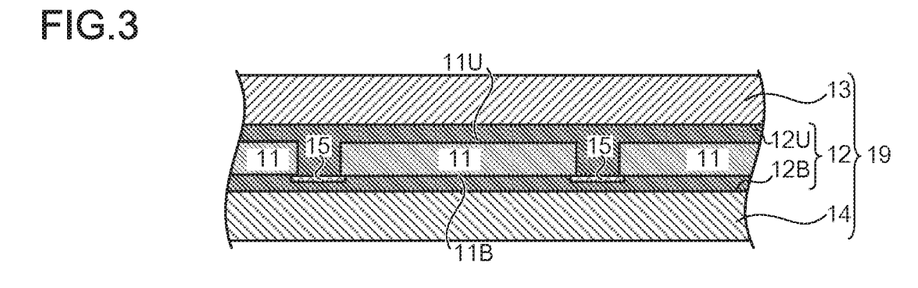
FIG. 3 is a cross-sectional view of a solar cell module mounted with backside electrode type solar cells.
Figure 4:
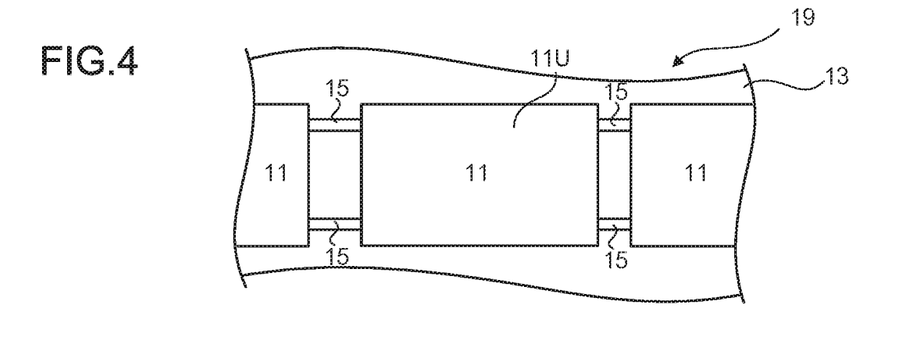
FIG. 4 is a plan view of the solar cell module of FIG. 3.

The connection wiring 15 bridges between the back surfaces 11B of the solar cells 11 and is bonded to the back surfaces 11B by solder, conductive adhesive or the like in the backside electrode type solar cells 11 as shown in FIGS. 3 and 4.

Figure 5:
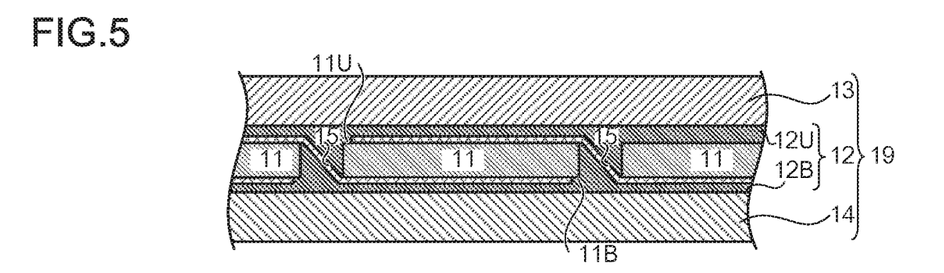
FIG. 5 is a cross-sectional view of a solar cell module mounted with double-sided electrode type solar cells.
Figure 6:
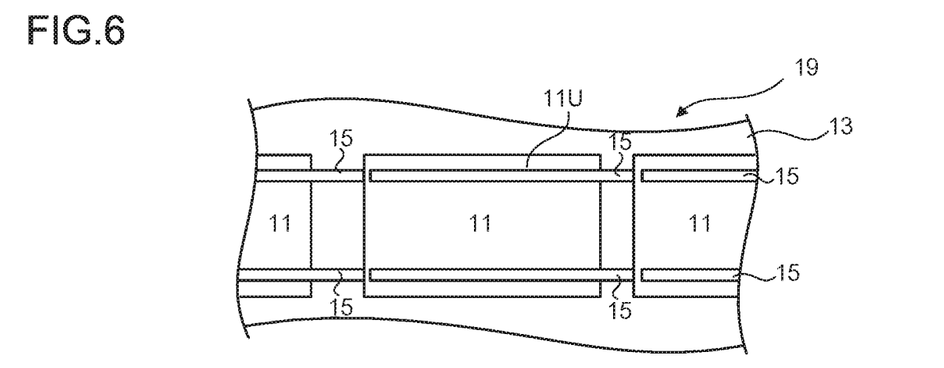
FIG. 6 is a plan view of the solar cell module of FIG. 5.

On the other hand, in the double-sided electrode type solar cells 11 as shown in FIGS. 5 and 6, the connection wiring 15 bridges between the light receiving surface 11U of one solar cell 11 and the back surface 11B of the other solar cell 11 and is bonded to the back surface 11B by solder, conductive adhesive or the like between adjacent ones of the solar cells 11.

The material of the wiring member 15 is not particularly limited, but copper, aluminum, silver, gold or an alloy containing any of these is given as an example. The material of the wiring member 15 may be metal with a coating layer in which the surface of metal such as copper, aluminum, silver, gold or an alloy containing any of these is coated with a conductive layer made of gold, silver, tin, solder or the like.

The wiring member 15 is preferably blackened to make a metal color difficult to see. This is because the designability of the solar cell module 19 is enhanced by the blackening process. A method for the blackening process is not particularly limited, but the coating of a black paint, the covering of a black base material or a surface processing by a chemical or the like is given as an example.

<Method for Manufacturing Solar Cell Module>

The method for manufacturing the solar cell module 19 is not particularly limited. For example, the light receiving side protection member 13, the light receiving side sealing material 12U, the solar cell 11 (solar cell string), the back-side sealing material 12B and the back-side protection member 14 may be laminated in this order, and sealing may be performed by heating and pressing at predetermined temperature and pressure, using a laminator for vacuum evacuation.

<<Regarding CIE1976L*a*b* Color System>>

The above solar cell module 19 is designed to develop the same type of color as a whole by satisfying conditions described below. In quantitatively evaluating color, a reflection spectrum in a visible light region measured using an analyzer such as a spectrocolorimeter, a spectral color difference meter, a spectral color meter or an ultraviolet visible spectrophotometer is used.

For the quantification of color based on the reflection spectrum, a CIE1976L*a*b* color system(L*: bright [+] to dark [−], a*: red [+] to green [−], b*: yellow [+] to blue [−]) standardized by the CIE (Commission Internationale de l'Éclairage) was used.

A method for detecting only diffused reflected light having a high correlation with evaluation by human visual observation (SCE: Specular Component Exclude) or a method for detecting both specularly reflected light and diffused reflected light easily reflecting the influence of luster (SCI: Specular Component Include) was used as a method for measuring a reflection color.

In this specification, a measurement value of the color of reflected light combining specularly reflected light and diffused reflected light based on light incident on an object to be measured shall be a measurement value Px(L*[Px], a*[Px], b*[Px]) and a measurement value of the color only of the diffused reflected light based on the light incident on the object to be measured shall be a measurement value Qx(L*[Qx], a*[Qx], b*[Qx]). For the sake of convenience, an identification code g, m, s, c, k, t is inserted into x.

A measurement light source used for the calculation of the reflection color is not particularly limited. A light source (e.g. D50, D55, D65, D75 or C light source) having a known spectral distribution may be used. A field of vision used for the calculation of the reflection color is also not particularly limited. For example, 10° or 2° specified by the CIE may be used.

The solar cell module 19 described below develops the same type of color as a whole and exhibits a high designability, such as by designing unique colors of constituent members of the solar cell module 19 described above or by designing the color in a state where the constituent members are overlapping each other.

If the solar cell module 19 develops the same type of color as a whole as just described, the designability of an exterior member is enhanced by harmonizing the color of the solar cell module 19 with that of the exterior member (wall surface, building material, building or the like) that is an installation position of the solar cell module 19. By making the color of the exterior member and that of the solar cell module 19 different, a pattern on the exterior member is, for example, formed by the solar cell module 19 to enhance the designability of the exterior member.

The solar cell module 19 serving as such a means for enhancing the designability of the exterior member and developing the same type of color as a whole is preferably designed to simultaneously satisfy at least conditions (1), (2) and (3), out of all combinations of the following conditions (1) to (5).

<Regarding Light Receiving Side Protection Member>

Regarding a unique color of the light receiving side protection member 13 included in the solar cell module 19.

In other words, a chroma C*[Pg] based on a measurement value Pg(L*[Pg], a*[Pg], b*[Pg]) and a chroma C*[Qg] based on a measurement value Qg(L*[Qg], a*[Qg], b*[Qg]) for the light receiving side protection member 13 itself preferably satisfy the following condition (1).

$$C^*[Pg] \leq 5, \text{ and}$$

$$C^*[Qg] \leq 5$$

where $$C^*[Pg]=(a^*[Pg]^2+b^*[Pg]^2)^{1/2}, \text{ and}$$

$$C^*[Qg]=(a^*[Qg]^2+b^*[Qg]^2)^{1/2} \qquad \text{[Condition (1)]}$$

If the above condition (1) is satisfied, the light receiving side protection member 13 itself has almost no color and transmits visible light in a wide wavelength range. As a result, in designing the color of the solar cell module 19, not only the influence of the color due to the light receiving side protection member 13 itself is suppressed, but also the light receiving amount of the solar cell module 11 is increased and the power generation amount of the solar cell module 19 is improved.

On the other hand, if the above condition (1) is not satisfied, the light receiving side protection member 13 itself has color, and a large amount of easily visually confirmable visible light is emitted as specularly reflected light from the light receiving side protection member 13. Thus, if the solar cell module 19 mounted with such a light receiving side protection member 13 is installed on a conspicuous wall surface or the like, the colored reflected light causes light pollution.

<A. Regarding Laminated Part of Each Member in Solar Cell Module>

Regarding the color of a part, in which the light receiving side protection member 13, the light receiving side sealing material 12U, the back-side sealing material 12B and the back-side protection member 14 are laminated in this order from the light receiving side to the back side, in the solar cell module 19.

In other words, a difference ΔT[m] between a chroma C*[Pm] based on a measurement value Pm(L*[Pm], a*[Pm], b*[Pm]) and a chroma C*[Qm] based on a measurement value Qm(L*[Qm], a*[Qm], b*[Qm]) by light incident on the above laminated part from the light receiving side protection member 13 preferably satisfies the following conditions (2).

$$\Delta T[m] \geq 6$$

where $$\Delta T[m]=C^*[Qm]-C^*[Pm]=(a^*[Qm]^2+b^*[Qm]^2)^{1/2}-(a^*[Pm]^2+b^*[Pm]^2)^{1/2}.$$

If the above condition (2) is satisfied, the chroma C*[Qm] having a high correlation with visual observation is large and the solar cell module is vividly visually confirmed. On the other hand, since the chroma C*[Pm] including the positive specularly light is small, reflected light is natural light having a color close to white and light pollution is suppressed even if the solar cell module is installed on a conspicuous wall surface or the like.

On the other hand, when both C[Qm] and C*[Pm] are small or when both C*[Qm] and C*[Pm] are large, the above condition (2) is not satisfied. When both C[Qm] and C*[Pm] are small, the solar cell module is colored and not visually confirmed. Thus, no effect on designability is exhibited. When both C* and C*[Pm] are large, light pollution is caused by the colored reflected light if the solar cell module is installed on the conspicuous wall surface or the like.

Since clearer light is obtained as ΔT[m] increases, ΔT[m] is, for example, more preferably 8 or more and even more preferably 10 or more.

A solar cell module including the light receiving side sealing material 12U added with the wavelength converting additive and the back-side protection member 14 blackened on the light receiving side is considered as an example of the solar cell module 19 satisfying the condition (2). In this case, although ultraviolet rays not contributing to power generation are converted into visible light by the wavelength converting additive, part of the converted visible light is absorbed by the back-side protection member 14 since the blackened back-side protection member 14 is employed.

On the other hand, the converted visible outgoing light makes the back-side protection member 14 inconspicuous by an optical path until reaching the back-side protection member 14, and the converted visible light tends to become conspicuous in the entire solar cell module 19. As a result, the solar cell module 19 easily develops the same type of color as a whole and the designability of the solar cell module 19 is extremely enhanced.

That is, such a solar cell module 19 does not absorb/reflect the visible light contributing to the power generation of the solar cell of dyes or the like, and enhances designability by sacrificing some of advantages of such visible light while utilizing the wavelength converting additive for converting into/emitting the visible light. In other words, the solar cell module 19 can be said to be balanced between power generation performance and designability.

A method for adjusting the value of ΔT[m] is not particularly limited, but the adjustment of the reflection color of the back-side protection member 14 or the adjustment of the type or blending amount of the wavelength converting additive contained in the light receiving side sealing material 12U is given as an example.

<B. Regarding Laminated Part of Each Member in Solar Cell Module>

Regarding a measurement value Qs(L*[Qs], a*[Qs], b*[Qs]) for a part, in which the light receiving side protection member 13, the light receiving side sealing material 12U and the solar cell 11 are laminated in this order from the light receiving side to the back side, in the solar cell module 19.

Specifically, a chromaticity difference ΔE[m−s] calculated from the measurement value Qs(L*[Qs], a*[Qs], b*[Qs]) by light incident on the above laminated part from the light receiving side protection member 13 and the measurement value Qm(L*[Qm], a*[Qm], b*[Qm]) used in setting the condition (2) preferably satisfies the following condition (3).

$$\Delta E[m-s] \leq 30$$

where $$\Delta E[m-s]=\{(L^*[Qm]-L^*[Qs])^2+(a^*[Qm]-a^*[Qs])^2+(b^*[Qm]-b^*[Qs])^2\}^{1/2}. \qquad \text{[Condition (3)]}$$

If the above condition (3) is satisfied, a chromaticity difference between light reflected from the back-side protection member 14 and transmitted through the back-side sealing material 12B, the light receiving side sealing material 12U and the light receiving side protection member 13 and light reflected from the solar cell 11 and transmitted through the light receiving side sealing material 12U and the light receiving side protection member 13 becomes small. Thus, the chromaticity difference is relatively small and the solar cell module 19 is seen to have the same type of color in the stage where the both members 14, 11 are assembled as the solar cell module 19.

On the other hand, if the above condition (3) is not satisfied, the solar cell 11 arranged on the back-side protection member 14 is visually confirmed to stand out due to a color difference between the members 14 and 11 and the solar cell module 19 is hardly seen to have the same type of color as a whole in the stage where the solar cell module 19 is assembled.

As ΔE[m–s] decreases, the solar cell module 19 is visually confirmed to have the same type of color as whole. Thus, ΔE[m–s] is, for example, more preferably 15 or less, even more preferably 10 or less. Since the solar cell 11 can be said to become less conspicuous also at a wide viewing angle as ΔE[m–s] decrease, not only the single solar cell module 19, but also the paved and installed solar cell modules 19 are also visually confirmed to have the same type of color.

A method for adjusting the value of ΔE[m–s] is not particularly limited, but the use of the back-side protection member 14 having the same type of color as the solar cell 11 (i.e. to satisfy the following condition (4)) or the provision of an anti-reflective layer or optical adjustment layer on the light receiving side of the solar cell 11 and the adjustment of the refractive index and thickness of the provided layer is given as an example.

<Regarding Solar Cell and Back-Side Protection Member>

Regarding unique colors of the solar cell 11 and the back-side protection member 14 included in the solar cell module 19.

In other words, a chromaticity difference ΔE[c–k] calculated from a measurement value Qc(L*[Qc], a*[Qc], b*[Qc]) for the solar cell 11 itself and a measurement value Qk(L*[Qk], a*[Qk], b*[Qk]) for the back-side protection member 14 itself preferably satisfies the following condition (4).

$$\Delta E[c-k] \leq 60$$

where $$\Delta E[c-k] = \{(L^*[Qc]-L^*[Qk])^2+(a^*[Qc]-a^*[Qk])^2+(b^*[Qc]-b^*[Qk])^2\}^{1/2}.$$ [Condition (4)]

If the above condition (4) is satisfied, a chromaticity difference between the both members 14 and 11 is small for the solar cell 11 arranged on the back-side protection member 14. In other words, the both members 14 and 11 having the same type of color are arranged, with the result that the solar cell module 19 is easily seen to have the same type of color as a whole. If the conditions (1) and (4) are simultaneously satisfied, the color of the solar cell module 19 is easily designed.

On the other hand, if the condition (4) is not satisfied, the solar cell 11 arranged on the back-side protection member 14 is visually confirmed to stand out due to a color difference between the members 14 and 11, and the solar cell module 19 is hardly seen to have the same type of color as a whole.

As ΔE[c–k] decreases, the solar cell module 19 is visually confirmed to have the same type of color as whole. Thus, ΔE[c–k] is, for example, more preferably 30 or less, even more preferably 15 or less. Since the solar cell 11 becomes less conspicuous also at a wide viewing angle as ΔE[c–k] decreases, not only the single solar cell module 19, but also the paved and installed solar cell modules 19 are also easily visually confirmed to have the same type of color.

A method for adjusting the value of ΔE[c–k] is not particularly limited, but the use of the back-side protection member 14 having the same type of color as the solar cell 11 is preferable. In other words, if the conditions (4) and (3) are simultaneously satisfied, the solar cell module 19 is easily seen to have the same type of color while having a sense of unity in terms of color and chroma.

The value of ΔE[c–k] may be adjusted, such as by providing an anti-reflective layer or optical adjustment layer on the light receiving side of the solar cell 11 and adjusting the refractive index and thickness of the provided layer.

<C. Regarding Laminated Part of Each Member in Solar Cell Module>

Regarding a measurement value Qt(L*[Qt], a*[Qt], b*[Qt]) for a part, in which the light receiving side protection member 13, the light receiving side sealing material 12U and the wiring member 15 are laminated in this order from the light receiving side to the back side, in the solar cell module 19.

Specifically, a chromaticity difference ΔE[m–t] calculated from the measurement value Qt(L*[Qt], a*[Qt], b*[Qt]) by light incident on the above laminated part from the light receiving side protection member 13 and the measurement value Qm(L*[Qm], a*[Qm], b*[Qm]) used in setting the condition (2) preferably satisfies the following condition (5).

$$\Delta E[m-t] \leq 30$$

where $$\Delta E[m-t] = \{(L^*[Qm]-L^*[Qt])^2+(a^*[Qm]-a^*[Qt])^2+(b^*[Qm]-b^*[Qt])^2\}^{1/2}.$$ [Condition (5)]

If the condition (5) is satisfied, a chromaticity difference between light reflected from the back-side protection member 14 and transmitted through the back-side sealing material 12B, the light receiving side sealing material 12U and the light receiving side protection member 13 and light reflected from the wiring member (i.e. wiring member 15 for connection or busbar electrode) and transmitted through the light receiving side sealing material 12U and the light receiving side protection member 13 becomes small. Thus, the chromaticity difference is relatively small and the solar cell module 19 is also seen to have the same type of color as a whole in the stage where the both members 14, 15 are assembled as the solar cell module 19.

On the other hand, if the above condition (5) is not satisfied, the wiring member 15 arranged on the back-side protection member 14 is visually confirmed to stand out due to a color difference between the members 14 and 15 and the solar cell module 19 is hardly seen to have the same type of color as a whole in the stage where the solar cell module 19 is assembled.

As ΔE[m–t] decreases, the solar cell module 19 is visually confirmed to have the same type of color as whole. Thus, ΔE[m–t] is, for example, more preferably 15 or less, even more preferably 10 or less. Since the wiring member 15 can be said to become less conspicuous also at a wide viewing angle as ΔE[m–t] decreases, not only the single solar cell module 19, but also the paved and installed solar cell modules 19 are also visually confirmed to have the same type of color.

A method for adjusting the value of ΔE[m–t] is not particularly limited, but the coloring of the surface on the light receiving side of the wiring member 15 to have the same type of color as the back-side protection member 14 is given as an example.

<Regarding External Environment>

A natural environment variously changes such as a fine weather and a cloudy weather. The solar cell modules 19 may be used as a means for changing the design of an exterior member (wall surface, building material, building or the like), on which the solar cell modules 19 are installed, according to this change.

Specifically, since a color temperature of sunlight in a fine weather is 5000 to 6000K and that of sunlight in a cloudy weather is 6000 to 7000K, in designing the color of the solar cell module 19, the following condition (6) is preferably satisfied by using light of a D50 light source [D50 light] having a color temperature of 5003K close to that of sunlight in the fine weather and light of a D65 light source [D65 light] having a color temperature of 6504K close to that of sunlight in the cloudy weather.

It is assumed that a measurement value of the color of the D50 light based on reflected light combining specularly reflected light and diffused reflected light based on light incident on an object to be measured is D50Px(L*[50Px], a*[50Px], b*[50Px]) and a measurement value of the color of the D50 light based on the diffused reflected light is D50Qx(L*[50Qx], a*[50Qx], b*[50Qx]).

It is assumed that a measurement value of the color of the D65 light based on reflected light combining specularly reflected light and diffused reflected light based on light incident on the object to be measured is D65Px(L*[65Px], a*[65Px], b*[65Px]) and a measurement value of the color of the D65 light based on the diffused reflected light is D65Qx(L*[65Qx], a*[65Qx], b*[65Qx]). An identification code g, m, s is inserted into x.

The condition (6) relates to the color of a part, in which the light receiving side protection member 13, the light receiving side sealing material 12U and the solar cell 11 are laminated in this order from the light receiving side toward the back side, in the solar cell module 19.

Specifically, a value ΔU[Qs] calculated from a measurement value D50Qs(L*[50Qs], a*[50Qs], b*[50Qs]) and a measurement value D65Qs(L*[65Qs], a*[65Qs], b*[65Qs]) by light incident on the above laminated part from the light receiving side protection member 13 preferably satisfies the following condition (6).

$$\Delta U[Qs] \geq 1$$

where $$\Delta U[Qs] = \{(L^*[50Qs] - L^*[65Qs])^2 + (a^*[50Qs] - a^*[65Qs])^2 + (b^*[50Qs] - b^*[65Qs])^2\}^{1/2}. \quad \text{[Condition (6)]}$$

This condition expression (6) represents a changing degree of the color of the solar cell 11 in the solar cell module 19 by light having different color temperatures. Accordingly, as the value ΔU[Qs] increases, the color of the solar cell 11 changes due to a change in the external environment such as a change in time, weather or season and, associated with that, the designability of the solar cell module 19 is enhanced.

On the other hand, if the above condition (6) is not satisfied, the color of the solar cell 11 is not changed by light having different color temperatures.

Since the solar cell module 19 becomes rich in variation corresponding to the external environment as ΔU[Qs] increases, ΔU[Qs] is preferably 2 or more, more preferably 3 or more. A method for adjusting the value of ΔU[Qs] is not particularly limited, but the adjustment of the type or blending amount of the wavelength converting additive contained in the light receiving side sealing material 12U is given as an example.

Only the condition (6) may be satisfied in terms of increasing a degree of freedom in designing the solar cell module 19, but it is preferable to satisfy the conditions (1) and (3) simultaneously with the condition (6) in making the solar cell module 19 look to have the same type of color as a whole.

The condition (1) is a condition not dependent on the light source. The following condition (1') is more preferable for the condition (6) from the viewpoint that the condition (6) depends on the light source.

In other words, a measurement value D50Pg(L*[50Pg], a*[50Pg], b*[50Pg]) and a measurement value D50Qg(L*[50Qg], a*[50Qg], b*[50Qg]) of the color of the D50 light for the light receiving side protection member 13 itself and a measurement value D65Pg(L*[65Pg], a*[65Pg], b*[65Pg]) and a measurement value D65Qg(L*[65Qg], a*[65Qg], b*[65Qg]) of the color of the D65 light for the light receiving side protection member 13 itself are used.

Specifically, a chroma C*[50Pg] based on the measurement value D50Pg(L*[50Pg], a*[50Pg], b*[50Pg]), a chroma C*[50Qg] based on the measurement value D50Qg(L*[50Qg], a*[50Qg], b*[50Qg]), a chroma C*[65Pg] based on the measurement value D65Pg(L*[65Pg], a*[65Pg], b*[65Pg]) and a chroma C*[65Qg] based on the measurement value D65Qg(L*[65Qg], a*[65Qg], b*[65Qg]) preferably satisfy the following condition.

$$C^*[50Pg] \leq 5,$$

$$C^*[50Qg] \leq 5,$$

$$C^*[65Pg] \leq 5, \text{ and}$$

$$C^*[65Qg] \leq 5$$

where $$C^*[50Pg] = (a^*[50Pg]^2 + b^*[50Pg]^2)^{1/2},$$

$$C^*[50Qg] = (a^*[50Qg]^2 + b^*[50Qg]^2)^{1/2},$$

$$C^*[65Pg] = (a^*[65Pg]^2 + b^*[65Pg]^2)^{1/2}, \text{ and}$$

$$C^*[65Qg] = (a^*[65Qg]^2 + b^*[65Qg]^2)^{1/2}. \quad \text{[Condition (1')]}$$

The condition (3) is a condition not dependent on the light source. The following condition (3') is more preferable for the condition (6) from the viewpoint that the condition (6) depends on the light source.

In other words, a measurement value D50Qm(L*[50Qm], a*[50Qm], b*[50Qm]) and a measurement value D65Qm (L*[65Qm], a*[65Qm], b*[65Qm]) by light incident from the light receiving side protection member 13 on a part, in which the light receiving side protection member 13, the light receiving side sealing material 12U, the back-side sealing material 12B and the back-side protection member 14 are laminated in this order from the light receiving side toward the back side, in the solar cell module 19 are used.

Further, a measurement value D50Qs(L*[50Qs], a*[50Qs], b*[50Qs]) and a measurement value D65Qs(L*[65Qs], a*[65Qs], b*[65Qs]) by light incident from the light receiving side protection member 13 on a part, in which the light receiving side protection member 13, the light receiving side sealing material 12U and the solar cell 11 are laminated in this order from the light receiving side toward the back side, in the solar cell module 19 are used.

Specifically, a chromaticity difference ΔE[50Qm–50Qs] calculated from the measurement value D50Qm(L*[50Qm], a*[50Qm], b*[50Qm]) and the measurement value D50Qs (L*[50Qs], a*[50Qs], b*[50Qs]) and a chromaticity difference ΔE[65Qm–65Qs] calculated from the measurement value D65Qm(L*[65Qm], a*[65Qm], b*[65Qm]) and the measurement value D65Qs(L*[65Qs], a*[65Qs], b*[65Qs]) preferably satisfy the following condition (3').

ΔE[50Qm–50Qs]≤30, and

ΔE[65Qm–65Qs]≤30 where $\Delta E[50Qm-50Qs]=\{(L*[50Qm]-L*[50Qs])^2+(a*[50Qm]-a*[50Qs])^2+(b*[50Qm]-b*[50Qs])^2\}^{1/2}$, and $\Delta E[65Qm-65Qs]=\{(L*[65Qm]-L*[65Qs])^2+(a*[65Qm]-a*[65Qs])^2+(b*[65Qm]-b*[65Qs])^2\}^{1/2}$. [Condition (3')]

At least one of the conditions (2), (4) and (5) may be satisfied at the same time as the above conditions (6), (1) (or (1')) and (3) (or (3')) are satisfied.

The condition (5) is a condition not dependent on the light source. The following condition (5') is more preferable for the condition (6) from the viewpoint that the condition (6) depends on the light source.

In other words, the measurement value D50Qm(L*[50Qm], a*[50Qm], b*[50Qm]) and the measurement value D65Qm(L*[65Qm], a*[65Qm], b*[65Qm]) by light incident from the light receiving side protection member 13 on the part, in which the light receiving side protection member 13, the light receiving side sealing material 12U, the back-side sealing material 12B and the back-side protection member 14 are laminated in this order from the light receiving side toward the back side, in the solar cell module 19 are used.

Further, a measurement value D50Qt(L*[50Qt], a*[50Qt], b*[50Qt]) and a measurement value D65Qt(L*[65Qt], a*[65Qt], b*[65Qt]) by light incident from the light receiving side protection member 13 on a part, in which the light receiving side protection member 13, the light receiving side sealing material 12U and the wiring member 15 are laminated in this order from the light receiving side toward the back side, in the solar cell module 19 are used.

Specifically, a chromaticity difference ΔE[50Qm–50Qt] calculated from the measurement value D50Qm(L*[50Qm], a*[50Qm], b*[50Qm]) and the measurement value D50Qt (L*[50Qt], a*[50Qt], b*[50Qt]) and a chromaticity difference ΔE[65Qm–65Qt] calculated from the measurement value D65Qm(L*[65Qm], a*[65Qm], b*[65Qm]) and the measurement value D65Qt(L*[65Qt], a*[65Qt], b*[65 Qt]) preferably satisfy the following condition (5').

ΔE[50Qm–50Qt]≤30, and

ΔE[65Qm–65Qt]≤30 where $\Delta E[50Qm-50Qt]=\{(L*[50Qm]-L*[50Qt])^2+(a*[50Qm]-a*[50Qt])^2+(b*[50Qm]-b*[50Qt])^2\}^{1/2}$, and $\Delta E[65Qm-65Qt]=\{(L*[65Qm]-L*[65Qt])^2+(a*[65Qm]-a*[65Qt])^2+(b*[65Qm]-b*[65Qt])^2\}^{1/2}$. [Condition (5')]

The present disclosure is not limited to the embodiment described above, and various modifications can be made within the scope set out in the claims. In other words, the technical scope of the present disclosure also includes embodiments obtained by combining technical means appropriately modified within the scope set out in the claims.

EXAMPLES

Hereinafter, the present disclosure will be described in detail by Examples. However, the present disclosure is not limited to these Examples. In the measurement of a reflection spectrum, a spectrocolorimeter produced by Nippon Denshoku Co., Ltd. (part number SD5000) was used.

<Regarding Light Receiving Side Protection Member>

Reflection spectra of reflected light combining specularly reflected light and diffused reflected light and reflected light composed only of the diffused reflected light were measured using the spectrocolorimeter for light receiving side protection members A to D described below. In this way, C*[50Pg], C*[50Qg] with the measurement light source D50 and at a viewing field condition of 10° and C*[65Pg], C*[65Qg] with the measurement light source D65 and at the viewing field condition of 10° were calculated. Table 1 shows a result.

Light Receiving Side Protection Member A
Cover glass for high transmittance solar cell formed of non-tempered glass having a thickness of 3 mm.

Light Receiving Side Protection Members B, C
Two types of cover glass for high transmittance solar cell formed of tempered glass with an anti-reflective film having a thickness of 3 mm.

Light Receiving Side Protection Member D
Light blue color glass having a thickness of 3 mm

TABLE 1

| Light Receiving Side Protection Member | Condition (1), Condition (1') | | | |
|---|---|---|---|---|
| | C* [Pg] | | C* [Qg] | |
| | C*[50 Pg] | C*[65 Pg] | C*[50 Qg] | C*[65 Qg] |
| Light Receiving Side Protection Member A | 0.19 | 0.20 | 0.24 | 0.22 |
| Light Receiving Side Protection Member B | 1.99 | 2.02 | 0.25 | 0.21 |
| Light Receiving Side Protection Member C | 2.76 | 2.73 | 0.09 | 0.08 |
| Light Receiving Side Protection Member D | 9.03 | 8.77 | 11.19 | 10.74 |

<Regarding Solar Cell and Back-Side Protection Member>

A reflection spectrum of reflected light composed only of diffused reflected light was measured using the spectrocolorimeter for the following members. In this way, ΔE[c–k] with the measurement light source D50 and at the viewing field condition of 10° was calculated. Table 2 shows an obtained result.

Solar Cell
Backside electrode type solar cell using a crystalline silicon substrate.

Backside Protection Member A
Sheet having a three-layer structure of black PET/aluminum foil/PET.

Backside Protection Member B
Sheet having a two-layer structure of white olefin/PET.

TABLE 2

| Backside-Side Protection Member | Condition (4) ΔE[c-k] |
|---|---|
| Back-Side Protection Member A | 10.14 |
| Back-Side Protection Member B | 88.54 |

<Regarding Solar Cell Module>

Example 1

In a solar cell module of Example 1, the above backside electrode type solar cell was used as a solar cell, the above light receiving side protection member A was used as a light receiving side protection member and the above back-side protection member A was used as a back-side protection member. Further, in the solar cell module of Example 1, an EVA sheet dispersed with a wavelength converting additive having blue fluorescence (sealing material A) was used as a light receiving side sealing material, and an EVA sheet containing no wavelength converting additive and no ultraviolet absorber (sealing material B) was used as a back-side sealing material. The above members were manufactured as the solar cell module by being laminated at 140° C. after being laminated and arranged as shown in FIGS. 1 and 2.

For the obtained solar cell module, reflection spectra of reflected light combining reflected light and diffused reflected light and reflected light composed only of the diffused reflected light were measured, and ΔT[m], ΔE[50Qm–50Qs], ΔE[65Qm–65Qs] and ΔU[Qs] were calculated from measurement values with the measurement light source D50 and the viewing field condition of 10° and those with the light source D65 and the viewing field condition of 10°. For the sake of convenience, a result of ΔT[m] using D50 light is written as ΔT[50m] and a result of ΔT[m] using D65 light is written as ΔT[65m].

In addition, the following observations (A) to (C) were made under sunlight, ○ was determined if applicable and x was determined if not applicable.
(A) Whether the solar cell module looks blue as a whole (○) or not (x)?
(B) Whether the specularly reflected light from the solar cell module has no color (○) or has color (x)?
(C) Whether the cells do not look to stand out (○) or do look to stand out (x) in the entire view of the solar cell module?

Comparative Example 1

Besides using the sealing material B as the light receiving side sealing material, a solar cell module was fabricated and similar measurements and observations were conducted by methods similar to those of Example 1.

Comparative Example 2

Besides using the back-side protection member B as a back-side protection member, a solar cell module was fabricated and similar measurements and observations were conducted by methods similar to those of Example 1.

Comparative Example 3

Besides using the sealing material B as a light receiving side sealing material and using the back-side protection member B as a back-side protection member, a solar cell module was fabricated and similar measurements and observations were conducted by methods similar to those of Example 1.

Comparative Example 4

Besides using the light receiving side protection member D as a light receiving side protection member, a solar cell module was fabricated and similar measurements and observations were conducted by methods similar to those of Comparative Example 2.

Comparative Example 5

Besides using the back-side protection member B as a back-side protection member, a solar cell module was fabricated and similar measurements and observations were conducted by methods similar to those of Comparative Example 4.

Comparative Example 6

Besides sandwiching and laminating a blue tape including a polyethylene film as a base material between a light receiving side protection member and a light receiving side sealing material, a solar cell module was fabricated and similar measurements and observations were conducted by methods similar to those of Comparative Example 2.

Comparative Example 7

Besides using the back-side protection member B as a back-side protection member, a solar cell module was fabricated and similar measurements and observations were conducted by methods similar to those of Comparative Example 6.

Table 3 shows the member configurations of the above Example and Comparative Examples, and Table 4 shows an obtained result. Example can be said to be the solar cell module that develops the same type of color as a whole since (○) was determined for all the observation items (A) to (C).

TABLE 3

| Sample | Light Receiving Side Protection Member | Light Receiving Side Sealing Material | Solar Cell | Back-Side Sealing Material | Back-Side Protection Member |
|---|---|---|---|---|---|
| Example 1 | Light Receiving Side Protection Member A | Sealing Material A | Backside Electrode Type | Sealing Material B | Back-Side Protection Member A |
| Comparative Example 1 | Light Receiving Side Protection Member A | Sealing Material B | Solar Cell | Sealing Material B | Back-Side Protection Member A |

TABLE 3-continued

| Sample | Light Receiving Side Protection Member | Light Receiving Side Sealing Material | Solar Cell | Back-Side Sealing Material | Back-Side Protection Member |
|---|---|---|---|---|---|
| Comparative Example 2 | Light Receiving Side Protection Member A | Sealing Material A | | Sealing Material B | Back-Side Protection Member B |
| Comparative Example 3 | Light Receiving Side Protection Member A | Sealing Material B | | Sealing Material B | Back-Side Protection Member B |
| Comparative Example 4 | Light Receiving Side Protection Member D | Sealing Material B | | Sealing Material B | Back-Side Protection Member A |
| Comparative Example 5 | Light Receiving Side Protection Member D | Sealing Material B | | Sealing Material B | Back-Side Protection Member B |
| Comparative Example 6 | Light Receiving Side Protection Member A | Sealing Material B + Colored Film | | Sealing Material B | Back-Side Protection Member A |
| Comparative Example 7 | Light Receiving Side Protection Member A | Sealing Material B + Colored Film | | Sealing Material B | Back-Side Protection Member B |

TABLE 4

| Sample | Condition (2) ΔT (m) ΔT (50 m) | ΔT (65 m) | Condition (3), (3') ΔE (50 Qm–50 Qs) | ΔE (65 Qm–65 Qs) | Condition (6) ΔU (Qs) | Visual Observation (A) | Visual Observation (B) | Visual Observation (C) |
|---|---|---|---|---|---|---|---|---|
| Example 1 | 14.06 | 15.19 | 6.22 | 6.53 | 3.57 | ○ | ○ | ○ |
| Comparative Example 1 | 0.76 | 0.94 | 1.05 | 0.95 | 0.20 | X | ○ | ○ |
| Comparative Example 2 | 0.69 | 0.72 | 49.43 | 49.69 | 3.57 | ○ | ○ | X |
| Comparative Example 3 | 0.05 | 0.04 | 50.37 | 50.41 | 0.20 | X | ○ | X |
| Comparative Example 4 | 0.31 | 0.32 | 3.39 | 3.32 | 0.47 | ○ | X | ○ |
| Comparative Example 5 | 2.82 | 2.60 | 44.42 | 44.36 | 0.47 | ○ | X | X |
| Comparative Example 6 | 2.86 | 3.07 | 2.28 | 2.10 | 0.71 | ○ | X | ○ |
| Comparative Example 7 | 5.08 | 4.30 | 41.46 | 39.95 | 0.71 | ○ | X | X |

Example 2

In a solar cell module of Example 2, members similar to those of Example 1 were used and flat square solder plated copper wires colored in black by a paint (wiring members A) were used as wiring members to be connected to electrodes of solar cells. Specifically, the above members are manufactured as the solar cell module by being laminated at 140° C. after being laminated and arranged as shown in FIGS. 3 and 4.

For the obtained solar cell module, reflection spectra of reflected light combining reflected light and diffused reflected light and reflected light composed only of the diffused reflected light were measured, and ΔE[50Qm–50Qt] in the case of the measurement light source D50 and the viewing field condition of 10° and ΔE[65Qm–65Qt] in the case of the measurement light source D65 and the viewing field condition of 10° were calculated.

In addition, the following observation (D) was made under sunlight, and ○ was determined if applicable and x was determined if not applicable.

(D) Whether the wiring members do not look to stand out (○) or do look to stand out (x) in the entire view of the solar cell module?

Comparative Example 8

Besides using unprocessed flat square solder plated copper wires (wiring members B), a solar cell module was fabricated and similar measurements and observations were conducted by methods similar to those of Example 2.

Comparative Example 9

Besides using the back-side protection member B as a back-side protection member, a solar cell module was fabricated and similar measurements and observations were conducted by methods similar to those of Example 2.

Table 5 shows a result of the above Example and Comparative Examples. Example can be said to be the solar cell module that develops the same type of color as a whole since (○) was determined for all the observation item (D).

TABLE 5

| Sample | Condition (5), (5') | | Visual Observation (D) |
|---|---|---|---|
| | ΔE[50 Qm − 50 Qt] | ΔE[65 Qm − 65 Qt] | |
| Example 2 | 4.37 | 5.21 | ○ |
| Comparative Example 8 | 64.33 | 64.37 | X |
| Comparative Example 9 | 50.41 | 50.71 | X |

What is claimed is:

1. A method for manufacturing a solar cell module including a solar cell; a light receiving side sealing material and a light receiving side protection member which are laminated and arranged in this order on a light receiving side with reference to the solar cell; and a back-side sealing material and a back-side protection member which are laminated and arranged in this order on a back side opposite to the light receiving side with reference to the solar cell, the method for manufacturing the solar cell module comprising configuring the light receiving side protection member, the light receiving side protection member on a first part, which is a part in which the light receiving side protection member, the light receiving side sealing material, the back-side sealing material and the back-side protection member are laminated in this order from the light receiving side toward the back side, and the light receiving side protection member on a second part, which is a part in which the light receiving side protection member, the light receiving side sealing material, and the solar cell are laminated in this order from the light receiving side toward the back side, to meet the following requirements:

calculating a value from a first measurement value Px(L*[Px], a*[Px], b*[Px]) of the color of reflected light, the first measurement value obtained from an analyzer configured to combine specularly reflected light and diffused reflected light based on light incident on a measurement object, the light incident on the measurement object including a color temperature in a range from 5000K to 7000 k, and a second measurement value Qx(L*[Qx], a*[Qx], b*[Qx]) of the color only of the diffused reflected light based on the light incident on the measurement object (CIE1976L*a*b* color system is used for L*, a*, b* and an identification code g, m, s, c, k, t is inserted into x), the second measurement value obtained from the analyzer, as follows:

(1) determining a chroma C*[Pg] obtained by measuring a third value Pg(L*[Pg], a*[Pg], b*[Pg]), the third value obtained from the analyzer, and a chroma C*[Qg] obtained by measuring a fourth value Qg(L*[Qg], a*[Qg], b*[Qg]) for the light receiving side protection member itself, the fourth value obtained from the analyzer, satisfy the following condition:

$C*[Pg] \leq 5$, and $C*[Qg] \leq 5$ where $C*[Pg]=(a*[Pg]^2+b*[Pg]^2)^{1/2}$, and $C*[Qg]=(a*[Qg]^2+b*[Qg]^2)^{1/2}$, (2) determining a difference ΔT[m] between a chroma C*[Pm] obtained by measuring a fifth value Pm(L*[Pm], a*[Pm], b*[Pm]), the fifth value obtained from the analyzer, and a chroma C*[Qm] obtained by measuring a sixth measurement value Qm(L*[Qm], a*[Qm], b*[Qm]) by light incident from the light receiving side protection member on a first part, the sixth value obtained from the analyzer, satisfies the following condition:

$\Delta T[m] \geq 6$ where $\Delta T[m]=C*[Qm]-C*[Pm]=(a*[Qm]^2+b*[Qm]^2)^{1/2}-(a*[Pm]^2+b*[Pm]^2)^{1/2}$, and (3) determining a chromaticity difference ΔE[m−s] calculated from the sixth measurement value Qm(L*[Qm], a*[Qm], b*[Qm]) in the (2) and a seventh measurement value Qs(L*[Qs], a*[Qs], b*[Qs]) by the light incident from the light receiving side protection member on a second part, the seventh measurement value obtained from the analyzer, satisfies the following condition:

$\Delta E[m-s] \leq 30$ where $\Delta E[m-s]=\{L*[Qm]-L*[Qs])^2+(a*[Qm]-a*[Qs])^2+(b*[Qm]-b*\{Qs\})^2\}^{1/2}$, and (6) determining a value ΔU[Qs] calculated from an eighth measurement value D50Qs(L*[50Qs], a*[50Qs], b*[50Qs]) of the color only of diffused reflected light based on D50 light, the eighth measurement value obtained from the analyzer, and a ninth measurement value D65Qs(L*[65Qs], a*[65Qs], b*[65Qs]) of the color only of diffused reflected light based on D65 light by the light incident from the light receiving side protection member on the second part, the ninth measurement value obtained from the analyzer, satisfies the following condition:

$\Delta U[Qs] \geq 1$ where $\Delta U[Qs]=\{(L*[50Qs]-L*[65Qs])^2+(a*[50Qs]-a*[65Qs])^2+(b*[50Qs]-b*[65Qs])^2\}^{1/2}$.

2. The method for manufacturing the solar cell module according to claim 1, further comprising (4) determining if a chromaticity difference ΔE[c−k] calculated from a tenth measurement value Qc(L*[Qc], a*[Qc], b*[Qc]) for the solar cell itself, the tenth measurement value obtained from the analyzer, and an eleventh measurement value Qk(L*[Qk], a*[Qk], b*[Qk]) for the back-side protection member itself, the eleventh measurement value obtained from the analyzer, satisfies the following condition:

$\Delta E[c-k] \leq 60$ where $\Delta E[c-k]=\{(L*[Qc]-L*[Qk])^2+(a*[Qc]-a*[Qk])^2+(b*[Qc]-b*[Qk])^2\}^{1/2}$.

3. The method for manufacturing the solar cell module according to claim 1, the solar cell module further comprising a wiring member, the method for manufacturing the solar cell module further comprising (5) determining a chromaticity difference ΔE[m−t] calculated from the sixth measurement value Qm(L*[Qm], a*[Qm], b*[Qm]) in the (2) and a twelfth measurement value Qt(L*[Qt], a*[Qt], b*[Qt]) by the light incident from the light receiving side protection member on a third part, the twelfth measurement value obtained from the analyzer, satisfies the following condition:

$$\Delta E[m-t] \leq 30$$

where $$\Delta E[m-t] = \{L*[Qm]-L*[Qt])^2 + (a*[Qm]-a*[Qt])^2 + (b*[Qm]-b*\{Qt\})^2\}^{1/2}, \text{ and}$$

the third part is a part in which in which the light receiving side protection member, the light receiving side sealing material, and the wiring member are laminated in this order from the light receiving side toward the back side.

4. A method for manufacturing a solar cell module, the solar cell module including a solar cell, a light receiving side sealing material and a light receiving side protection member which are laminated and arranged in this order on a light receiving side with reference to the solar cell, and a back-side sealing material and a back-side protection member which are laminated and arranged in this order on a back side opposite to the light receiving side with reference to the solar cell, the method for manufacturing the solar cell module comprising configuring the light receiving side protection member, the light receiving side protection member on a first part, which is a part in which the light receiving side protection member, the light receiving side sealing material, the back-side sealing material and the back-side protection member are laminated in this order from the light receiving side toward the back side, and the light receiving side protection member on a second part, which is a part in which the light receiving side protection member, the light receiving side sealing material, and the solar cell are laminated in this order from the light receiving side toward the back side, to meet the following requirements:

calculating a value from a first measurement value D50Px (L*[50Px], a*[50Px], b*[50Px]) of the color of reflected light, the first measurement value obtained from an analyzer configured to combine specularly reflected light and diffused reflected light and a second measurement value D50Qx(L*[50Qx], a*[50Qx], b*[50Qx]) of the color only of the diffused reflected light based on D50 light incident on a measurement object, the second measurement value obtained from the analyzer, the light incident on the measurement object including a color temperature in a range from 5000K to 7000 k, and a third measurement value D65Px(L*[65Px], a*[65Px], b*[65Px]) of the color of reflected light, the third measurement value obtained from the analyzer configured to combine specularly reflected light and diffused reflected light and a fourth measurement value D65Qx(L*[65Qx], a*[65Qx], b*[65Qx]) of the color only of the diffused reflected light based on D65 light incident on the measurement object (CIE1976L*a*b* color system is used for L*, a*, b* and an identification code g, m, s is inserted into x), the fourth measurement value obtained from the analyzer, as follows:

(1') determining a chroma C*[50Pg] obtained by measuring a fifth value D50Pg(L*[50Pg], a*[50Pg], b*[50Pg]), a chroma C*[50Qg] obtained by measuring a sixth value D50Qg(L*[50Qg], a*[50Qg], b*[50Qg]), a chroma C*[65Pg] obtained by measuring a seventh value D65Pg(L*[65Pg], a*[65Pg], b*[65Pg]) and a chroma C*[65Qg] obtained by measuring an eighth value D65Qg(L*[65Qg], a*[65Qg], b*[65Qg]) for the light receiving side protection member itself, each of the fifth value, the sixth value, the seventh value, and the eighth value measured by the analyzer, satisfy the following condition:

$$C*[50Pg] \leq 5,$$

$$C*[50Qg] \leq 5,$$

$$C*[65Pg] \leq 5, \text{ and}$$

$$C*[65Qg] \leq 5$$

where $$C*[50Pg] = (a*[50Pg]^2 + b*[50Pg]^2)^{1/2},$$

$$C*[50Qg] = (a*[50Qg]^2 + b*[50Qg]^2)^{1/2},$$

$$C*[65Pg] = (a*[65Pg]^2 + b*[65Pg]^2)^{1/2}, \text{ and}$$

$$C*[65Qg] = (a*[65Qg]^2 + b*[65Qg]^2)^{1/2},$$

(3') determining a chromaticity difference $\Delta E[50Qm-50Qs]$ and a chromaticity difference $\Delta E[65Qm-65Qs]$ calculated from a ninth measurement value D50Qm(L*[50Qm], a*[50Qm], b*[50Qm]) and a tenth measurement value D65Qm(L*[65Qm], a*[65Qm], b*[65Qm]) by light incident from the light receiving side protection member on a first part and an eleventh measurement value D50Qs(L*[50Qs], a*[50Qs], b*[50Qs]) and a twelfth measurement value D65Qs(L*[65Qs], a*[65Qs], b*[65Qs]) by the light incident from the light receiving side protection member on a second part, each of the ninth measurement value, the tenth measurement value, the eleventh measurement value, and the twelfth measurement value measured by the analyzer, satisfy the following condition:

$$\Delta E[50Qm-50Qs] \leq 30, \text{ and}$$

$$\Delta E[65Qm-65Qs] \leq 30$$

where $$\Delta E[50Qm-50Qs] = \{(L*[50Qm]-L*[50Qs])^2 + (a*[50Qm]-a*[50Qs])^2 + (b*[50Qm]-b*[50Qs])^2\}^{1/2}, \text{ and}$$

$$\Delta E[65Qm-65Qs] = \{(L*[65Qm]-L*[65Qs])^2 + (a*[65Qm]-a*[65Qs])^2 + (b*[65Qm]-b*[65Qs])^2\}^{1/2},$$

(6) determining a thirteenth value $\Delta U[Qs]$ calculated from the eleventh measurement value D50Qs(L*[50Qs], a*[50Qs], b*[50Qs]) and the twelfth measurement value D65Qs(L*[65Qs], a*[65Qs], b*[65Qs]) satisfies the following condition:

$$\Delta U[Qs] \geq 1$$

where $$\Delta U[Qs] = \{(L*[50Qs]-L*[65Qs])^2 + (a*[50Qs]-a*[65Qs])^2 + (b*[50Qs]-b*[65Qs])^2\}^{1/2}.$$

5. The method for manufacturing the solar cell module according to claim 4, the solar cell module further comprising a wiring member, the method for manufacturing the solar cell module further comprising (5') determining a chromaticity difference ΔE[50Qm−50Qt] and a chromaticity difference ΔE[65Qm−65Qt] calculated from the ninth measurement value D50Qm (L*[50Qm], a*[50Qm], b*[50Qm]) and the tenth measurement value D65Qm(L*[65Qm], a*[65Qm], b*[65Qm]) in the (3') and a fourteenth measurement value D50Qt(L*[50Qt], a*[50Qt], b*[50Qt]) and a fifteenth measurement value D65Qt(L*[65Qt], a*[65Qt], b*[65Qt]) by the light incident from the light receiving side protection member on a third part, each of the fourteenth measurement value and the fifteenth measurement value measured by the analyzer, satisfy the following condition:

$$\Delta E[50Qm-50Qs] \leq 30, \text{ and}$$

$$\Delta E[65Qm-65Qs] \leq 30$$

where $$\Delta E[50Qm-50Qs]=\{(L^*[50Qm]-L^*[50Qs])^2+(a^*[50Qm]-a^*[50Qs])^2+(b^*[50Qm]-b^*[50Qs])^2\}^{1/2}, \text{ and}$$

$$\Delta E[65Qm-65Qs]=\{(L^*[65Qm]-L^*[65Qs])^2+(a^*[65Qm]-a^*[65Qs])^2+(b^*[65Qm]-b^*[65Qs])^2\}^{1/2}, \text{ and}$$

the third part is a part in which the light receiving side protection member, the light receiving side sealing material, and the wiring member are laminated in this order from the light receiving side toward the back side.

6. The method for manufacturing the solar cell module according to claim 1, wherein
the light receiving side sealing material contains a wavelength converting additive.

7. The method for manufacturing the solar cell module according to claim 1, wherein
the solar cell is a backside junction type solar cell.

8. The method for manufacturing the solar cell module according to claim 3, wherein
the wiring member is a blackened wiring member.

9. The method for manufacturing the solar cell module according to claim 1, the solar cell module further comprising a plurality of the solar cells, the method for manufacturing the solar cell module further comprising
a part of a major surface on the light receiving side of one solar cell and a part of a major surface on the back side of the other solar cell overlap between adjacent ones of the solar cells.

10. The method for manufacturing the solar cell module according to claim 2, the solar cell module further comprising a wiring member, the method for manufacturing the solar cell module further comprising (5) determining a chromaticity difference ΔE[m−t] calculated from the sixth measurement value Qm(L*[Qm], a*[Qm], b*[Qm]) in the (2) and a sixteenth measurement value Qt(L*[Qt], a*[Qt], b*[Qt]) by the light incident from the light receiving side protection member on a third part, the sixteenth measurement value measured by the analyzer, satisfies the following condition:

$$\Delta E[m-t] \leq 30$$

where $$\Delta E[m-t]=\{L^*[Qm]-L^*[Qt])^2+(a^*[Qm]-a^*[Qt])^2+(b^*[Qm]-b^*[Qt])^2\}^{1/2}, \text{ and}$$

the third part is a part in which in which the light receiving side protection member, the light receiving side sealing material, and the wiring member are laminated in this order from the light receiving side toward the back side.

11. The method for manufacturing the solar cell module according to claim 2, wherein
the light receiving side sealing material contains a wavelength converting additive.

12. The method for manufacturing the solar cell module according to claim 4, wherein
the light receiving side sealing material contains a wavelength converting additive.

13. The method for manufacturing the solar cell module according to claim 2, wherein
the solar cell is a backside junction type solar cell.

14. The method for manufacturing the solar cell module according to claim 4, wherein
the solar cell is a backside junction type solar cell.

15. The method for manufacturing the solar cell module according to claim 5, wherein
the wiring member is a blackened wiring member.

16. The method for manufacturing the solar cell module according to claim 2, the solar cell module further comprising
a plurality of the solar cells, wherein
a part of a major surface on the light receiving side of one solar cell and a part of a major surface on the back side of the other solar cell overlap between adjacent ones of the solar cells.

17. The method for manufacturing the solar cell module according to claim 4, the solar cell module further comprising
a plurality of the solar cells, wherein
a part of a major surface on the light receiving side of one solar cell and a part of a major surface on the back side of the other solar cell overlap between adjacent ones of the solar cells.

* * * * *